United States Patent [19]

Kobayashi et al.

[11] Patent Number: 5,210,041

[45] Date of Patent: May 11, 1993

[54] PROCESS FOR MANUFACTURING SEMICONDUCTOR INTEGRATED CIRCUIT DEVICE

[75] Inventors: Tsuneo Kobayashi, Tokorozawa; Kensuke Nakata, Sayama, both of Japan

[73] Assignee: Hitachi, Ltd., Tokyo, Japan

[21] Appl. No.: 732,280

[22] Filed: Jul. 18, 1991

[30] Foreign Application Priority Data

Jul. 24, 1990 [JP] Japan ................... 2-195424

[51] Int. Cl.⁵ .................... H01L 21/66; H01L 21/304
[52] U.S. Cl. ........................ 437/8; 437/190; 437/194; 437/195; 437/209
[58] Field of Search .................. 437/8, 209, 194, 195, 437/190

[56] References Cited

U.S. PATENT DOCUMENTS

| 4,607,219 | 8/1986 | Isosaka | 437/8 |
| 4,731,855 | 3/1988 | Suda et al. | |
| 4,740,079 | 4/1988 | Koizumi et al. | |
| 4,777,146 | 10/1988 | Bylsma et al. | 437/8 |
| 4,918,377 | 4/1990 | Buehler et al. | 437/8 |
| 4,985,988 | 1/1991 | Littlebury | 437/8 |
| 5,047,711 | 9/1991 | Smith et al. | 437/8 |

FOREIGN PATENT DOCUMENTS 59-32130 2/1984 Japan.
60-171736 9/1985 Japan.
61-65444 4/1986 Japan.

OTHER PUBLICATIONS

Semiconductor Fabrication in the Age of the 0.8 to 0.5-μm Process, pp. 1-12 (English), pp. 35-40 (Japanese), issued on Nov. 2, 1989 by Press Journal.
Laboratory and Factory Automation for VLSI Development and Mass Production (invited) pp. 736-739, issued in Aug. 1988 IEDM.

Primary Examiner—Brian E. Hearn
Assistant Examiner—Kevin M. Picardat
Attorney, Agent, or Firm—Pennie & Edmonds

[57] ABSTRACT

A wafer manufacturing process for a semiconductor integrated circuit device, including testing the semiconductor wafer at a unit of chip each time a predetermined treating step is performed. The test results are feed to a computer control for restricting succeeding treatments or further testing of chip or chips based on the test results and the predetermined number of chips to be produced. Semiconductor wafer(s) is/are loaded for manufacture on the basis of the number of chips to be produced, taking into account of any losses created by defective chips detected during each testing step and any excess created by additional semiconductor wafers loaded in response to shortages created by defects. The excess chips are monitored by the computer control and any succeeding treatments or further testing of the excess chips are halted to save time and manufacturing costs.

12 Claims, 13 Drawing Sheets

PROCESS FOR MANUFACTURING SEMICONDUCTOR INTEGRATED CIRCUIT DEVICE

BACKGROUND OF THE INVENTION

The present invention relates to a technology for manufacturing a semiconductor integrated circuit device and, more particularly, to a process for manufacturing a semiconductor integrated circuit device and a production control technology in a wafer process and a fabrication step.

The process for fabricating a semiconductor integrated circuit device is broadly divided into the following three steps, for example. That is to say: a wafer process; a wafer testing step and a fabrication step. The wafer process is one for forming an integrated circuit in a semiconductor wafer (which will be shortly referred to as the "wafer"). The wafer process is composed of a plurality of treating steps such as thin film forming step, a pattern transfer step, an etching step, an impurity doping step, a heat treating step and a rising step. The integrated circuit is formed in each of semiconductor chips (which will be shortly referred to as the "chips") over the wafer by combining those treating steps skillfully.

Incidentally, the production control at the unit of wafer has been performed in the wafer process of the prior art. According to the prior art, for example, tests for detecting a foreign substance or a pattern defect is performed in the wafer process, and the detected data are those for deciding the propriety of the wafer at the testing step. Specifically, the wafer, in which a predetermined number or more of chips are defective as a result of the tests, is disposed of. On the other hand, the wafer which has been tested to be free of defects is further processed.

After the end of all the treating steps of the wafer process, the wafer testing step is started. In the wafer testing step, the tip of a probe is brought into abutment against the electrodes of all the chips over the wafer to decide the propriety of each chip. It is not before this stage that the number of the non-defective or defective chips to be obtained from the wafer is clarified.

Incidentally, the wafer process technology is disposed on pp. 35 to 40 of "Recent Semiconductor Process Technology of '90" issued on Nov. 2, 1989 by PRESS JOURNAL, for example.

On the other hand, the testing technology of testing defects in the semiconductor wafer is disclosed in Japanese Patent Laid-Open No. 171736/1985 laid open on Sep. 5, 1985, for example.

On the other hand, the automation of VLSI manufacture is disclosed on pp. 736 to 739 of Technical Digest of 1988 IEEE IEDM (i.e., International Electron Devices Meeting) issued in 1988, for example, Incidentally, we have found the following problems in the production control method in the aforementioned wafer process of the prior art.

Specifically, the prior art is troubled by a problem that the production control at the unit of chip is not performed in the wafer process, namely, that what is performed is the production control at the unit of wafer. As a result, the non-defective chips to be finally formed over the wafer which later becomes defective during further treatments raise shortage problems and any surplus chips resulting from deliberate excess wafer introduced to account for defective chips increase manufacturing costs and time.

In the prior art, for example, there are introduced into the wafer process excess wafers so that more chips than the desired final number of chips to account for the defective chips. Since the production control is not performed at the unit of chip in the prior art, the number of non-defective chips is unknown in the wafer process. As a result, all the chips over the wafer are treated notwithstanding whether or not the chips might be excessive. In case excessive chips are formed, there arises a problem that the number of treatments, materials and the time period for the treatments are wasted to an extent corresponding to the excessiveness.

In the prior art, on the other hand, the tests are performed in the wafer process, but no production control is performed at the unit of chip. Thus the propriety of each of the chips over the wafer is unknown. Therefore, all the chips over the wafer are treated notwithstanding their proprieties. In other words, even the chip, which has been deteriorated in the wafer process, is treated. This raises a problem that the number of treatments, materials and the time period for the treatments are wasted to an extent corresponding to the treatment of the defective chips. Especially in case the number of non-defective chips is short of the number of chips to be attained, the number of defective chips is large and wasteful. In case, moreover, the number of chips to be attained is short in the testing steps, new wafers have to be loaded to recover the shortage. In case the chips are short, there arises another problem that the production cost rises. In the prior art, still moreover, the number of short chips is not found till the end of the wafer testing step. Therefore, the start of manufacturing the short chips has to be delayed till the end of the wafer testing step. In case of short chips, therefore, there arises another problem that it takes a long time to retain a necessary number of non-defective chips, thus making it difficult to retain the delivery.

These problems are anticipated to become serious for the future trends in the semiconductor integrated circuit device, such as ① customization, ② high integration or enlargement, and ③ shortening of the time period for the delivery.

① Customization: In recent years, it has been progressed to develop and manufacture customized products such as ASIC (i.e., Application Specific IC). In the customized products such as the ASIC, the chips designed according to the required specifications of a user are produced in a number required by the user. As a result, the kinds of products are usually increased, but the number of each product is smaller than that of memories or the like. As a result, a reduction in the production cost cannot be expected by the effect of mass production. Specifically, the production cost depends upon how a desired number of product chips is produced neither excessively nor shortly. In the production control method of the prior art, however, the fluctuations in the chip production yield are intense, and the obtainable non-defective chips are liable to become excessive or short, so that the production cost seriously fluctuates. As a result, it is difficult for the production control method of the prior art to cope with the productions of more kinds and less number.

② High Integration and Enlargement: The semiconductor integrated circuit device has a coming trend to progress a larger capacity and a higher function. It is also apparent to progress the high integration of the elements and the enlargement of the chips. If the chips are enlarged, the number of chips to be formed over the wafer is reduced. Moreover, if the chips are large-sized and if the elements are highly integrated (to have a finer structure), the percentage of defects due to foreign substances is increased to drop the chip production yield. In the production control method of the prior art, the loss of the production cost is increased to raise the production cost. As a result, the production control method of the prior art finds it difficult to cope with the manufacture of a semiconductor integrated circuit device which is highly integrated to have larger chips.

③ Shortened Time Period for Delivery: The customized product such as the ASIC takes the more number and longer time period for its development as it is given the higher functions. On the contrary, the existing products go fast out of fashion to have shorter lifetimes. As a result, the requirements for shortening the time period from the development to the trial manufacture and for the delivery by the user get more and more strict. In the production control method of the prior art, however, the manufacture of the short chips cannot be started before the end of the wafer testing step. It takes a long time to retain a required number of chips. This discussion likely applies to the corrections or defect analyses of the mask at the trial stage. Thus, the production control method of the prior art finds it difficult to cope with the shortening the time period for delivery.

SUMMARY OF THE INVENTION

The present invention has been conceived in view of the problems thus far described and has an object to provide a technology capable of suppressing the fluctuations in the production cost of the semiconductor integrated circuit device and reducing the production cost.

Another object of the present invention is to provide a technology capable of suppressing the fluctuations in the time period for the manufacture of the semiconductor integrated circuit device and shortening the time period for the manufacture.

Still another object of the present invention is to provide a technology capable of coping the customization, high integration, enlargement and shortened time period for delivery of the semiconductor integrated circuit device.

The aforementioned and other objects and novel features of the present invention will become apparent from the description to be made with reference to the accompanying drawings.

The representatives of the invention to be disclosed herein will be summarized in the following.

(1) In a wafer process for manufacturing a semiconductor integrated circuit device by subjecting a semiconductor wafer to a plurality of treating steps, according to the present invention, there is provided a process for manufacturing a semiconductor integrated circuit device, comprising the steps of: testing the semiconductor wafer at a unit of chip each time a predetermined one of the treating steps is ended; and feeding control data for restricting a treating step after the test, the treatment of the testing step or a chip to be tested, forward to a treating step or testing step preceding the test by at least one in accordance with the data of each chip based upon the test results.

(2) According to another feature of the present invention, the control data for restricting the chip are fed forward to the step after the end of the wafer process.

(3) In a wafer process for manufacturing a semiconductor integrated circuit device by subjecting a wafer to a plurality of treating steps, according to a further feature of the present invention, there is provided a process for manufacturing a semiconductor integrated circuit device, comprising the steps of: testing the semiconductor wafer at a unit of chip each time a predetermined one of the treating steps is ended; and feeding control data for restricting a treating step before the test or a chip to be subjected to a testing step, if it is decided in accordance with the information of each chip based upon the test results that the number of non-defective chips at the testing step exceeds the necessary number for the testing step, forward to a treating step or testing step preceding the test by at least one.

(4) In a wafer process for manufacturing a semiconductor integrated circuit device by subjecting a wafer to a plurality of treating steps, according to a further feature of the present invention, there is provided a process for manufacturing a semiconductor integrated circuit device, comprising the repeated steps of: testing the semiconductor wafer at a unit of chip each time a predetermined one of the treating steps is ended; preparing control data for loading another semiconductor wafer on the basis of the data of each of the chips and feeding the control data back to a predetermined treating step of the wafer process if it is decided in accordance with the data of each chip based upon the test results that the number of non-defective chips at the testing stage is short of the necessary number for the testing step; performing the tests of the semiconductor wafers including the another one; and monitoring the data of the chips of the initially loaded semiconductor wafer and the added semiconductor wafer synthetically and feeding control data for loading another semiconductor wafer, each time it is decided that the number of non-defective chips is short of the necessary number for the testing step in its entirety, back to a predetermined treating step of the wafer process.

(5) In a wafer process for manufacturing a semiconductor integrated circuit device by subjecting a wafer to a plurality of treating steps, according to a further feature of the present invention, there is provided a process for manufacturing a semiconductor integrated circuit device, comprising the commands of: testing the semiconductor wafer at a unit of chip each time a predetermined one of the treating steps is ended; preparing control data for loading another semiconductor wafer on the basis of the data of each of the chips and feeding the control data back to a predetermined treating step of the wafer process if it is decided in accordance with the data of each chip at the testing stage that the number of non-defective chips is short of the necessary number for the testing step; repeating performing the tests of the semiconductor wafers including the another one, monitoring the data of the chips of the initially loaded semiconductor wafer and the added semiconductor wafer synthetically, and feeding control data for loading another semiconductor wafer, each time it is decided that the number of non-defective chips is short of the necessary number for the testing chip in its entirety, back to a predetermined treating step of the wafer process; preparing control data for restricting the chip to be subjected to a treating step before the test and a testing step, if it is decided as a result of the data of the chips that the number of non-defective chips exceeds the necessary number at the testing stage, and feeding the control data as the treating data for another succeeding semiconductor wafer back to the treating step and testing step preceding the test by at least one; and preparing control data for restricting a chip to be subjected to the treating step after the test on the basis of the data of the chip, and feeding the control data back to a treating step preceding the test by at least one.

(6) In a wafer process for manufacturing a semiconductor integrated circuit device by subjecting a semiconductor wafer to a plurality of treating steps, according to the present invention, there is provided a process for manufacturing a semiconductor integrated circuit device, comprising the steps of: testing the semiconductor wafer at a unit of chip each time a predetermined one of the treating steps is ended; preparing control data for revising a defect, if discovered by comparing the test results and the designed reference data of the treating step preceding the test on the basis of the compared data; and revising the defect immediately after the test on the basis of the control data.

(1) Control data for treating only the non-defective chips on the basis of the data such as the positional coordinates prepared by tests in the wafer process are prepared and fed forward to the treating step after the tests so that the defective chips need not be treated at the time of the treating step after the tests. In other words, the treatments of the defective chips can be reduced from the wafer process.

Moreover, the data such as the number of non-defective chips prepared by the tests in the wafer process are monitored. If the number of the non-defective chips is decided to be excessive at the testing stage, control data for treating only a necessary number of non-defective chips are prepared on the basis of the foregoing data and fed forward to the treating step after the tests. At the treating step after the tests, the excessive non-defective chips need not be treated. In other words, the treatments for the finally excessive chips can be reduced in the wafer process.

(2) Control data for testing only the non-defective chips on the basis of the data such as the positional coordinates of the non-defective chips prepared by the tests of the wafer process are prepared and fed forward to the wafer testing step so that the defective chips need not be tested at the wafer testing step. In other words, the tip of a probe may be brought into abutment against only the non-defective chips at the wafer testing step.

(3) The excessive ones of the non-defective chips of a subsequent another wafer need not be treated. In other words, the treatments of the excessive non-defective chips can be reduced in the wafer process.

(4) The short chips can be supplied in the wafer process. In addition, at the time of manufacturing the short chips, the number of wafers to be loaded and the number of chips to be set in the wafer can be set to the optimized values on the basis of the data of the chips. Since the wafer set with such a number of chips as is equal to that of the short chips is loaded each time the chips become short, the number of finally obtainable non-defective chips will be neither excessive nor short. In other words, the number of finally obtainable non-defective chips can be adjusted in the wafer process. Since, moreover, the manufacture of the short chips is started in the wafer process, it is possible to shorten the time period for retaining a necessary number of non-defective chips.

(5) The short chips can be supplied in the wafer process, and the treatments of the excessive chips can be reduced in the wafer process. In other words, the number of finally obtainable non-defective chips can be adjusted in the wafer process. In addition, the treatments after the tests of the chips, which have been decided to be defective as a result of the tests in the wafer process, need not be performed. As a result, it is possible to obtain only a necessary number of non-defective chips finally over the wafer. Since, moreover, the manufacture of the short chips in the wafer process is started, it is possible to shorten the time period for retaining a necessary number of non-defective chips.

(6) The positional coordinates of the defective chips, the defective portions and the degree of defectiveness can be tested faster and more precisely than the prior art from the data of the aforementioned chips. Since, moreover, the revisions are performed immediately after the tests on the basis of the defect revising data obtained from the investigation results, it is possible to improve the reliability and workability of the revisions drastically. Still moreover, the fluctuations of the chip production yield can be suppressed by revising the defective chips in the wafer process.

DESCRIPTION OF THE PREFERRED EMBODIMENTS

Embodiment 1

Figure 1:
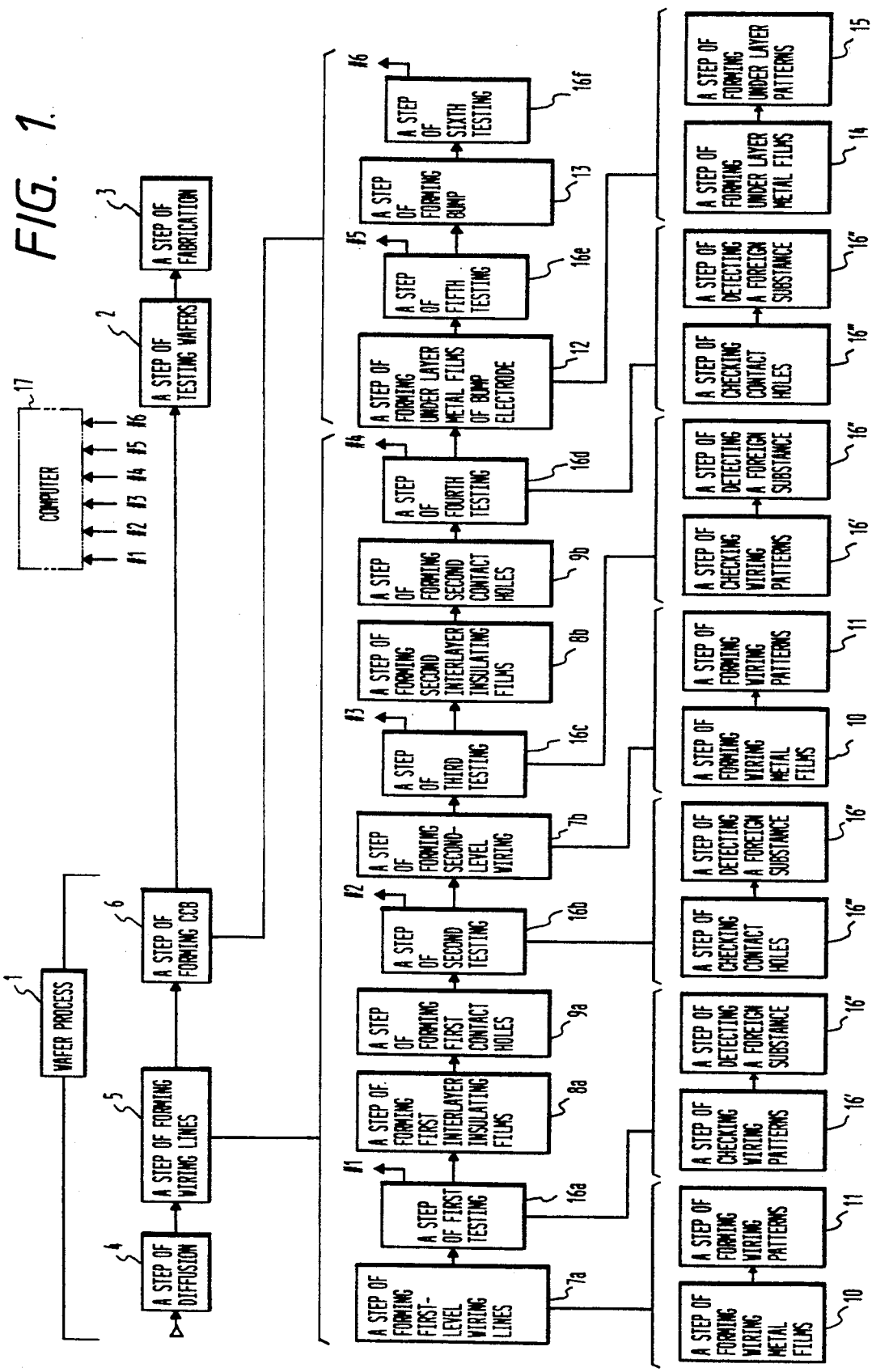
FIG. 1 is a flow chart showing a process for manufacturing a semiconductor integrated circuit device according to one embodiment of the present invention.
Figure 2:
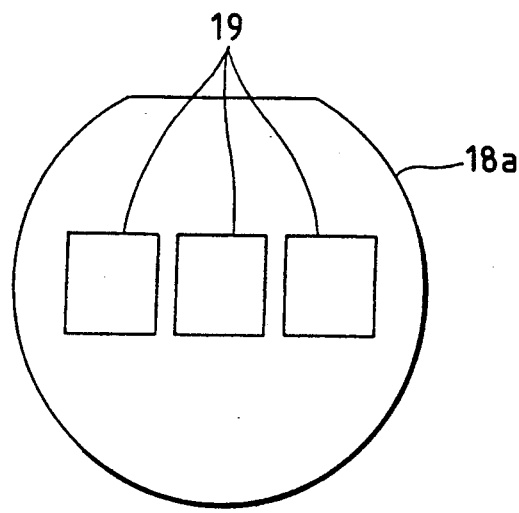
FIG. 2 is a top plan view showing a wafer to be used in the process for manufacturing the semiconductor integrated circuit device of Embodiment 1.
Figure 3:
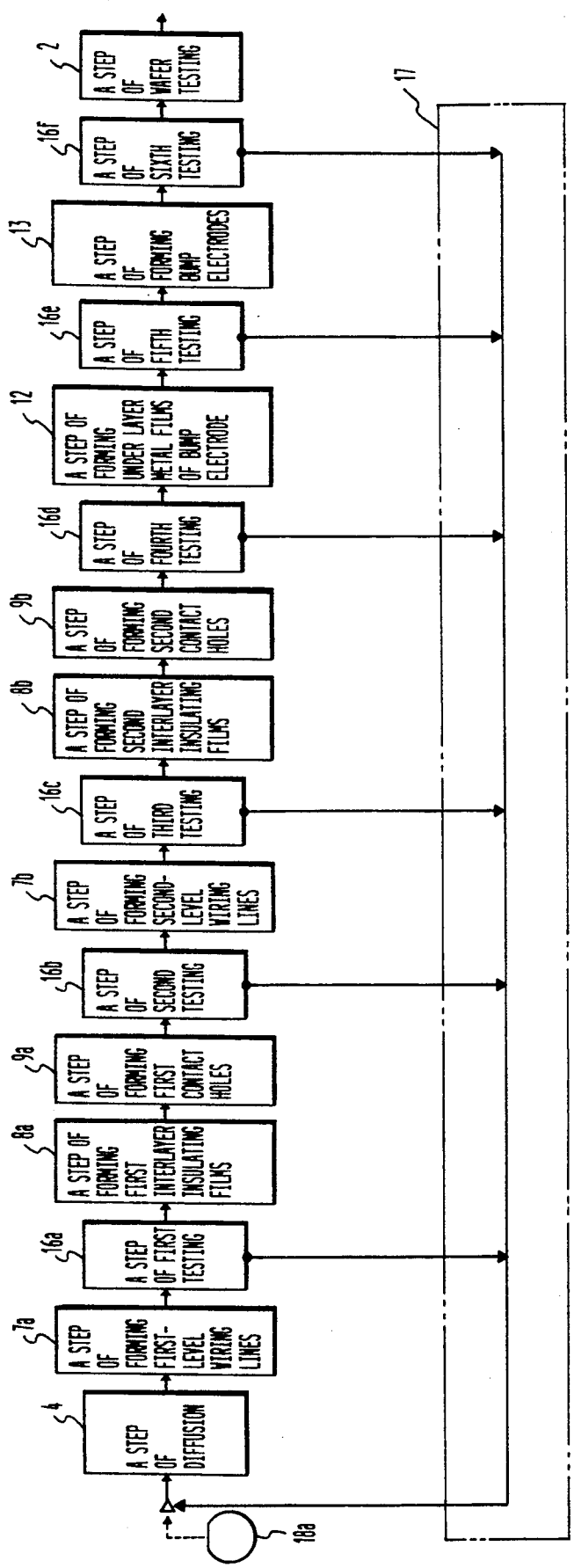
FIG. 3 and FIGS. 4(a) and 4(b) are flow charts showing feedback loops of the control data which are prepared on the basis of the result of inspections having been accomplished in the wafer process of Embodiment 1.
Figure 4A:
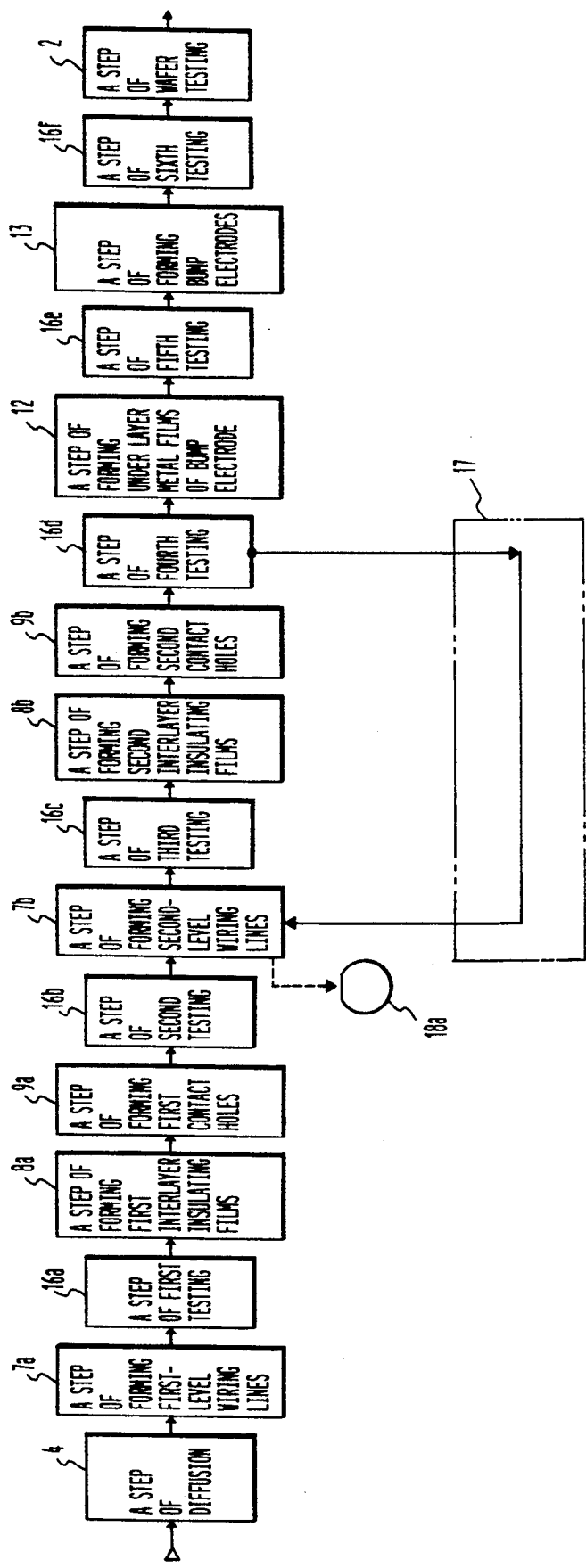
Figure 4B:
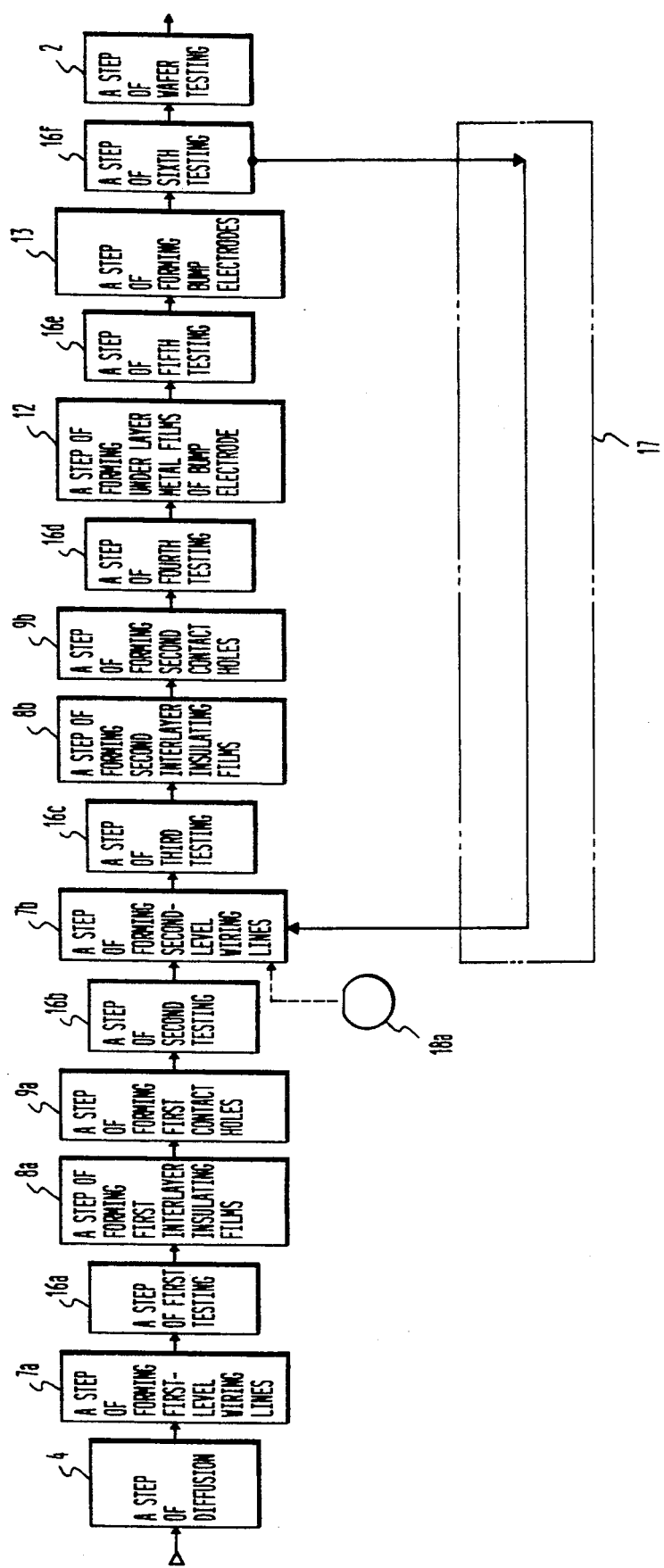

FIG. 1 is a flow chart showing a process for manufacturing a semiconductor integrated circuit device according to one embodiment of the present invention. FIG. 2 is a top plan view showing a wafer to be used in the process for manufacturing the semiconductor integrated circuit device of Embodiment 1. FIG. 3 and FIGS. 4(a) and 4(b) are flow charts showing feedback loops of the control data which are prepared on the basis of the result of inspections having been accomplished in the wafer process of Embodiment 1.

The process for manufacturing the semiconductor integrated circuit device according to Embodiment 1 is divided broadly into the following three steps: a wafer process 1; a wafer testing step 2; and a fabrication step 3.

The wafer process 1 is further divided into the following three steps: a diffusion step 4; a wiring line forming step 5; and a CCB (i.e., Controlled Collapse Bonding) forming step 6.

The wiring line forming step 5 is further divided into the following six steps: first- and second-level wiring line forming steps 7a and 7b; first and second interlayer insulating film forming steps 8a and 8b; and first and second contact hole forming steps 9a and 9b. Of these, the first- and second-level wiring line forming steps 7a and 7b are further divided into a wiring metal film forming step 10 and a wiring pattern forming step 11.

On the other hand, the CCB forming step 6 is further divided into the following two steps: a step 12 of forming underlayer metal films of bump electrode; and a bump forming step 13. Of these, the underlayer metal film forming step 12 is further divided into an underlayer metal film forming step 14 and an underlayer pattern forming step 15.

Incidentally, a semiconductor integrated circuit device having the CCB is disclosed in U.S. patent application Ser. No. 07/406,548, for example, which was filed in U.S.A. on Sep. 13, 1989. On the other hand, the CCB forming step itself is disclosed in U.S. patent application Ser. No. 07/174,371, which was filed in U.S.A. on Mar. 28, 1988. The contents of these Patent Applications are incorporated herein by reference.

In Embodiment 1, there are inserted a first testing step 16a to a sixth testing step 16f, for example, after the ends of predetermined steps of the wiring line forming step 5 and the CCB forming step 6. In each of the testing steps 16a to 16f, the test is accomplished at a unit of a chip on the later-described wafer. The first and third testing steps 16a and 16c are inserted, for example, after the ends of the first- and second-level wiring line forming steps 7a and 7b, respectively. In the first and third testing steps 16a and 16c, each chip on the wafer is subjected to a wiring pattern checking step 16' and a foreign substance detecting step 16''. Moreover, the second and fourth testing steps 16b and 16d are inserted, for example, after the first and second contact hole forming steps 9a and 9b, respectively. In the second and fourth testing steps 16b and 16d, each chip on the wafer is subjected to a contact hole checking step 16''' and the foreign substance detecting test 16''. Still moreover, the fifth and sixth testing steps 16e and 16f are inserted, for example, after the ends of the underlayer metal film forming step 12 and the bump forming step 13, respectively. In the fifth testing step 16e, each chip is tested, for example, on the shape or color tone of the underlayer metal pattern of the bump. In the sixth testing step 16f, each chip is tested, for example, on the shape or color tone of a solder bump.

The test results of the individual testing steps 16a to 16f are transmitted to a computer 17. On the basis of the test results, the computer 17 makes the following chip data, for example. Specifically, the data may include the propriety of each chip on the wafer, the positional coordinates of non-defective and defective chips on the wafer, the numbers of non-defective and defective chips, the positional coordinates of defective portions, the degree of defectiveness, and the kind of defectiveness. By these data, the computer 17 is enabled to monitor and grasp the states of the chips on the wafer during the wafer process 1. In this case, the computer 17 can monitor and grasp the states of the chips on one wafer. The computer 17 can additionally monitor and grasp the states of the chips of a plurality of wafers synthetically.

The computer 17 has its main memory stored with reference values to be obtained at each of the testing steps 16a to 16f such as the number of non-defective chips or the yield of chips. The reference values can be calculated by substituting the following variables, for example, into their formula. The values are: the total number of the steps of the wafer process 1; the positions of the individual testing steps 16a to 16f; the number of wafers to be loaded; the number of total chips on the wafers; the number of non-defective chips required at the final stage of the wafer process; the area of the chips; and the minimum sizes of the elements or wiring lines. The reference values are stored in numerical forms or their deducing formula in the main memory of the computer 17. This computer 17 compares the reference values with the aforementioned chip data which are attained at the individual testing steps 16a to 16f. By these comparisons, the computer 17 is enabled to device whether or not the number of non-defective chips finally obtainable is short at the stage of a predetermined one of the testing steps 16a to 16f.

On the basis of the aforementioned chip data, moreover, the computer 17 prepares the following three control data, for example. The first is the control data for adjusting the number of non-defective chips in the wafer process 1; the second is the control data for inhibiting the treatment and testing of the chips, which turn defective in the wafer process, after the tests; and the third is the control data for revising the defects immediately after the tests.

First of all, the first control data for adjusting the number of non-defective chips will be described in the following. The first control data are classified into the following two. The first is the control data for reducing the number of non-defective chips to be processed (as will be called the "reduction data"). The second is the control data for loading another wafer (as will be called the "loading data").

The reduction data are prepared if it is decided as the test result that the number of the non-defective chips finally obtainable is excessive. The method of transmitting the reduction data is divided into the following two cases. The first is the case of feed forward after the treating step after the test. The reduction data of this case are the treating data of the tested wafer. The second is the case of feedback to the treating step before the test. The reduction data of this case are the treating data of another succeeding wafer. The method of reducing the treatment of another wafer is conceivable to be divided into the following two. The first is the method of reducing the treatments of the individual non-defective chips on another succeeding wafer. The second is the method of interrupting the treatment of the entirety of another succeeding wafer and stocking the wafer at that stage. In Embodiment 1, the number of treatments of excessive chips can be reduced at an early state in the wafer process 1.

On the other hand, the aforementioned loading data are prepared if it is decided as the test result that the number of non-defective chips finally obtainable is short. In this case, the wafer loading method is conceivable to be divided into the following two. The first is the method of loading a new wafer from the first step of the wafer process 1. The second is the method of re-loading the wafer which is stocked in an intermediate step of the wafer process 1. In Embodiment 1, the deficient chip can be supplied by that loading data at an early stage of the wafer process 1. By these first control data, moreover, the number of non-defective chips can be adjusted in the wafer process 1.

Next, the second control data for inhibiting the treatment of the defective chip will be described in the following. The second control data are those for inhibiting the treatment and test of the chip which has been decided to be defective at the testing steps 16a to 16f. The control data are prepared of those data of the aforementioned chip, which are related to the positional coordinates of the non-defective or defective chips. In Embodiment 1, it is made possible by the control data to reduce the spare treatment of the defective chip at an early step in the wafer process 1.

Finally, third control data for revising the defectives will be described in the following. The third are the control data for revisions immediately after the predetermined testing steps 16a to 16f if the defective is decided at the testing steps. The control data are prepared the positional coordinates or number of the defective chips, the positional coordinates or degree of the defectives, and the kinds of the defectives of the aforementioned data of the chip. At this time, the computer 17 is also capable of preparing the control data for revising the mask used before the tests or the treating conditions (such as the gas flow rate, the wafer temperature or the gas atmosphere or temperature for the deposition or etching) before the tests.

Incidentally, the foreign substance detection is disclosed in U.S. Pat. No. 4,740,079, for example. Moreover, the technology for testing the circuit pattern of the chip to be tested such as an LSI wafer is disclosed in Japanese Patent Laid-Open No. 65444/1986, which is laid open on Apr. 4, 1986, or U.S. Pat. No. 4,731,855. The contents of these publications are incorporated herein by reference.

Next, the wafer to be used in the process for manufacturing the semiconductor integrated circuit device of Embodiment 1 will be described in the following. In Embodiment 1, the description to be made is directed to the case, in which only one chip for the product is arranged over a single wafer.

A wafer 18a, as shown in FIG. 2, is made of a single crystal of Si, for example, The wafer 18a has a diameter of about 3 inches. The wafer 18a has its main face mirror-polished. The principal face of the wafer 18a is arranged generally at the center with a product chip 19. This product chip 19 is interposed between two testing chips 19, for example. These testing chips 19 are subjected to such tests as cannot be undergone for the product chip 19 in the wafer process 1. One test item is to test the electric characteristics by bringing the tip of a probe into abutment against with the electrodes of the testing chips 19. Incidentally, the number of the testing chips 19 should not be restricted to two.

Next, the process for manufacturing the semiconductor integrated circuit device according to Embodiment 1 will be described with reference to FIG. 1 to FIGS. 4(a) and 4(b). In Embodiment 1, a plurality of MOSFET elements are to be formed in the chip 19 on the wafer 18a.

The case, in which one product chip is to be manufactured from one sheet of the wafer 18a, will be described with reference to FIG. 3.

At the diffusion step, the following treatments are to be performed, for example. In accordance with the ordinary manufacturing process of the MOSFET, a field insulating film and a gate insulating film are formed at first over the wafer 18a. Subsequently, a gate electrode made of polycrystalline silicon is formed over the gate insulating film. After this, the gate electrode and the field insulating film are used as the mask to implant the wafer 18a in self-alignment with impurity ions. After this, an annealing treatment is performed to form a source region and a drain region.

Next, the following treatments are performed, although omitted from the flow chart. At first, an insulating film of PSG is deposited over the wafer 18a by the CVD (i.e., Chemical Vapor Deposition). Subsequently, the insulating film is formed at its predetermined portions by the photo-lithography with contact holes, through which the source region, the drain region and the gate electrode are exposed to the outside.

In the subsequent step 7a of forming first-level wiring lines, the following treatments are performed, for example. First of all, a wiring metal film made of aluminum (Al) or the like is deposited by the PVD (i.e., Physical Vapor Deposition) over the wafer 18a. Subsequently, the wiring metal film is selectively etched to form the pattern of first-level wiring lines by the photo-lithography.

After the first-level wiring lines have been patterned, a first test is performed. This first testing step 16a is accomplished by the following three tests. The first is to test the wiring line pattern in each chip 19 by the SEM (i.e., Scanning Electron Microscope) image processing method or the like. At this time, it is tested whether or not the wiring lines are broken or whether or not the adjoining wiring lines are shorted. The second is to detect a foreign substance in each chip 19 by the SEM image processing method. The third is to test the electric characteristics of the testing chips 19 by bringing the tip of the probe into abutment against the electrodes of the chips 19. These test results are transmitted to the computer 17. The computer 17 prepares the data of each chip 19 on the basis of the test results. If the product chip 19 is decided to be defective, the computer 17 prepares the following two control data, for example. The first is the loading data for loading another wafer 18a. The computer 17 feeds the loading data back to the first step of the wafer process 1. At the first step of the wafer process 1, a new wafer 18a is loaded on the basis of the loading data. On the other hand, the second is the control data for inhibiting the wafer 18a which has its product chip 19 decided to be defective. In accordance with the control data, the wafer 18a having the defective product chip 19 is disposed of.

In this meanwhile, the wafer 18a having stood the test advances the first interlayer insulating film forming step 8a and the first contact hole forming step 9a sequentially. In the first interlayer insulating film forming step 8a, an interlayer insulating film of PSG or the like is deposited over the wafer 18a by the CVD method or the like. In the first contact hole forming step 9a, moreover, the interlayer insulating film is formed at its predetermined portions by the photo-lithography with contact holes, through which the underlying first-level wiring lines are exposed to the outside.

At the end of the first contact hole forming step 9a, the second test is performed. This second testing step 16b is accomplished by the following three tests. The first is to test the open state of the contact holes in each chip 19 by the image processing method or the like. The second is to detect a foreign substance in each chip 19 by the SEM image processing method or the like. The third is to test the electric characteristics of the testing chips 19 like the first testing step 16a. In case of failure to pass the test, the computer 17 performs the data processing like that which has been described in the aforementioned testing step 16a. In short, the wafer 18a having failed to pass is disposed of and is replaced by a new wafer 18a.

On the other hand, the wafer 18a having passed the test advances to the second-level wiring line forming step 7b. In this second-level wiring line forming step 7b, a treatment like that of the aforementioned first-level wiring line forming step 7a is performed to form second-level wiring lines over the interlayer insulating film. After this, the third test is performed. In this third testing step 16c, a test like that of the aforementioned first testing step 16a is performed. In case of failure to pass this test, the computer 17 performs a data processing like that which has been described in the aforementioned first testing step 16a.

On the other hand, the wafer 18a having passed the test advances to the second-level interlayer insulating film forming step 8b and the second contact hole forming step 9b sequentially. In these second-level interlayer film forming step 8b and second contact hole forming step 9b, respectively, treatments like those of the first-level interlayer film forming step 8a and the first contact hole forming step 9a are performed. After this, the fourth test is performed. In this fourth testing step 16d, a test like that of the aforementioned second testing step 16b is performed. In case of failure to pass the test, the computer 17 performs a data processing like that which has been described in the aforementioned first testing step 16a.

On the other hand, the wafer 18a having passed the test advances to the step 12 of forming underlayer metal films of bump electrode. In this underlayer metal film forming step 12, the following treatments are performed. First of all, a plurality of metal films are sequentially laminated over the wafer 18a by the PVD method or the like to form metal films having the laminated structure. After this, the laminated metal films are selectively etched by the photo-lithography to form a bump underlayer pattern 20.

After this pump underlayer pattern 20 has been formed, a fifth test is performed. In this fifth testing step 16e, the following two tests are performed, for example. Specifically, the first is to test the shape, color tone and so on of the bump underlayer pattern 20 in each step 19 by the predetermined optical image processing method or the like.

The second is to test the electric characteristics of the testing chips 19 like that of the first testing step 16a. In case of failure to pass the test, the computer 17 performs a data processing like that which has been described in the aforementioned first testing step 16a.

On the other hand, the wafer 18a having passed the test advances to the bump forming step 13. In this bump forming step 13, a bump made of a solder or the like is formed over the bump underlayer pattern 20. After this, the sixth test is performed. In this sixth testing step 16f, the following two tests are performed, for example. Specifically, the first is to test the shape, color tone and so on in each chip 19 by the predetermined optical image processing method or the like. The second is to test the electric characteristics of the testing chips 19 like the first testing step 16a. In case of failure to pass the test, the computer 17 performs a data processing like that which has been described in the aforementioned first testing step 16a.

On the other hand, the wafer having passed the test advances to the wafer testing step 2. In this wafer testing step 2, the testing chips 19 having their electric characteristics tested by bringing the tip of a probe into abutment against the electrodes of the testing chips 19.

Thus, in Embodiment 1, each chip 19 is tested at the individual testing steps 16a to 16f. The wafer 18a is disposed of and is replaced by new one 18a if its product chips 19 are decided to be defective in each of the testing steps 16a to 16f. On the other hand, the wafer 18a having passed the individual testing steps 16a to 16f advances to the subsequent steps. As a result, the wafer testing step 2 can be reached by only the wafer 18a which has passed the individual items of the testing steps 16a to 16f. Incidentally, a number of product chips are set over one wafer in case only one product chip is to be manufactured by the conventional method. However, the treatments having been applied to the chips other than the necessary one or ones are useless no matter how high or low the chip production yield might be. In case of Embodiment 1, only one product chip 19 is set at first over the wafer 18a. Moreover, the number of non-defective chips 19 to arrive at the wafer testing step 2 is one so that no uselessnes occurs unlike the prior art. Next, the case, in which a plurality of wafers 18a each arranged with only one production chip 19 are prepared to manufacture a predetermined amount of product chips from the group of wafers 18a, will be described with reference to FIGS. 4(a) and 4(b). Incidentally, the treating contents of the individual treating steps 4 to 6 (as shown in FIG. 1) and the testing contents of the individual testing steps 16a to 16f are identical to the aforementioned ones. Therefore, here will be described the controls for forming non-defective chips in the wafer process.

First of all, there are prepared more wafers 18a than the necessary product chips, for example. Then, the process line is loaded with all the wafers 18a sheet by sheet, for example. The computer 17 always monitors and grasps the states of all the chips 19 of the group of the wafers 18a synthetically on the basis of the test results of the individual testing steps 16a to 16f. Let it be assumed here that the number of non-defective chips to be finally manufactured is decided to be excessive at the instant when the wafer 18a having been loaded at first reaches the testing step 16d. Then, the computer 17 prepares the control data for reducing the number of non-defective chips to be treated. In this meanwhile, the computer 17 confirms the position of the step of the wafer 18a loaded finally. Let it be further assumed that the finally loaded wafer 18a exists in the second testing step 16b. Then, the computer 17 feeds the reduction data prepared in the fourth testing step 16d back to the second-level wiring line forming step 7b. As a result, in the second-level wiring step 7b, the treatment of the finally loaded wafer 18a is interrupted, and the wafer 18a is stocked.

Let it be further assumed that the number of non-defective chips finally obtainable is decided to be short at the instant when the initially loaded wafer 18a reaches the sixth testing step 16f. Then, the computer 17 prepares the control data for loading another wafer 18a. Here are prepared the data for loading again the wafer 18a in the stocked state. And, the computer 17 feeds the loading data, which have been prepared in the sixth testing step 16f, back to the second-level wiring line forming step 7b, as shown in FIG. 4(b). Then, the wafer 18a in the stocked state is loaded again in the second-level wiring line forming step 7b. In case the wafer 18a is still short, a new wafer 18a is loaded from the first step of the wafer process 1, as has been described hereinbefore.

Thus, the following effects can be attained according to Embodiment 1.

(1) In case only one product chip is required, the wafer 18a used can be set with only one product chip 19 to reduce the treatments of the chip, which might otherwise be excessive as in the prior art.

(2) Thanks to the aforementioned effect (1), the number of treatments, the material to be treated and so on can be reduced to spare the cost to an extent corresponding to the reduction of the excessive treatments. As a result, it is possible to drop the costs for the manufacture of the semiconductor integrated circuit device and for the products.

(3) Thanks to the aforementioned effect (1), the time period for the treatments can be shortened to an extent corresponding to the reduction of the excessive treatments. As a result, it is possible to shorten the time period for manufacturing the semiconductor integrated circuit device.

(4) In case a plurality of wafers 18a each arranged with only one product chip 19 are prepared for manufacturing a predetermined number of product chips from the group of the wafers 18a, the number of non-defective chips 19 in the whole group of the wafers 18a is synthetically monitored in the wafer process 1 to reduce or supply the chips at a stage, in which the number of non-defective chips finally obtainable is decided to be excessive or short, so that the number of the finally obtainable non-defective chips can be adjusted in the wafer process 1. As a result, it is possible to obtain a necessary number of non-defective chips at last.

(5) Thanks to the aforementioned effect (4), no excessive treatment is performed on the excessive chips or defective chips so that the number of treatments, the material to be treated and so on can be reduced to spare the cost.

(6) Thanks to the aforementioned effects (4) and (5), it is possible to reduce the cost for the manufacture of the semiconductor integrated circuit device and for the cost of the products.

(7) Thanks to the aforementioned effect (4), it is possible to supply the chips, if short, at an early stage of the wafer process 1.

(8) Thanks to the aforementioned effects (4) and (7), it is possible to suppress the cost for the manufacture of the semiconductor integrated circuit device and the fluctuations in the time period for the manufacture.

(9) Thanks to the aforementioned effects (4) and (7), the time period for manufacturing the semiconductor integrated circuit device can be shortened to shorten the time period for delivering the products.

(10) Thanks to the aforementioned effects (1) to (9), it is possible to cope with the customization, high integration and enlargement of the chip of the semiconductor integrated circuit device.

Embodiment 2

Figure 5:
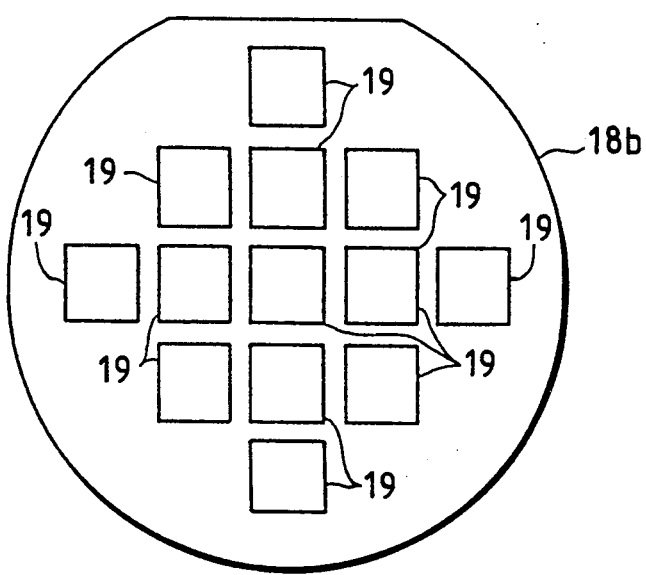
FIG. 5 is a top plan view showing a wafer to be used in a process for manufacturing the semiconductor integrated circuit device according to another embodiment of the present invention.
Figure 6:
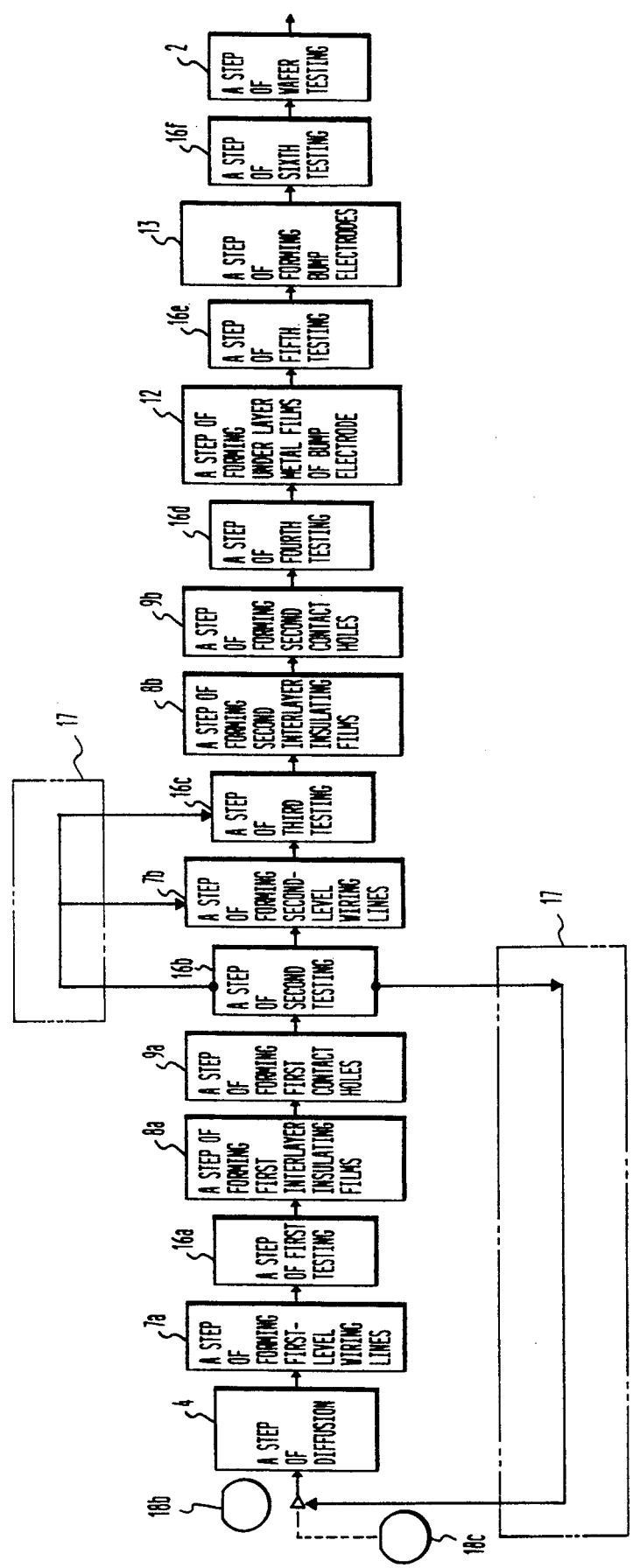
FIG. 6 is a flow chart showing a feedback loop and a feed forward loop for the control data which are prepared on the basis of instructions having been accomplished in the wafer processor of Embodiment 2.
Figure 7A:
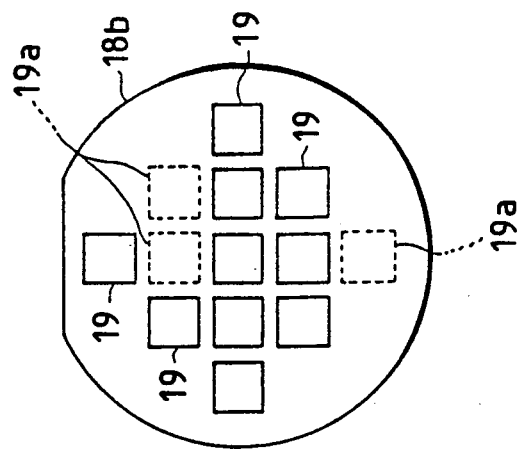
FIGS. 7(a) to 7(c) are top plan views showing a wafer in the process for manufacturing the semiconductor integrated circuit device according to Embodiment 2.
Figure 7B:
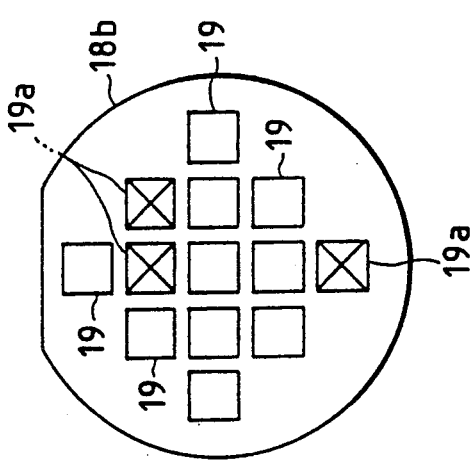
Figure 7C:
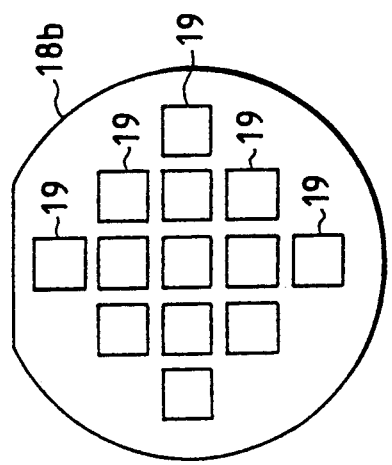
Figure 8:
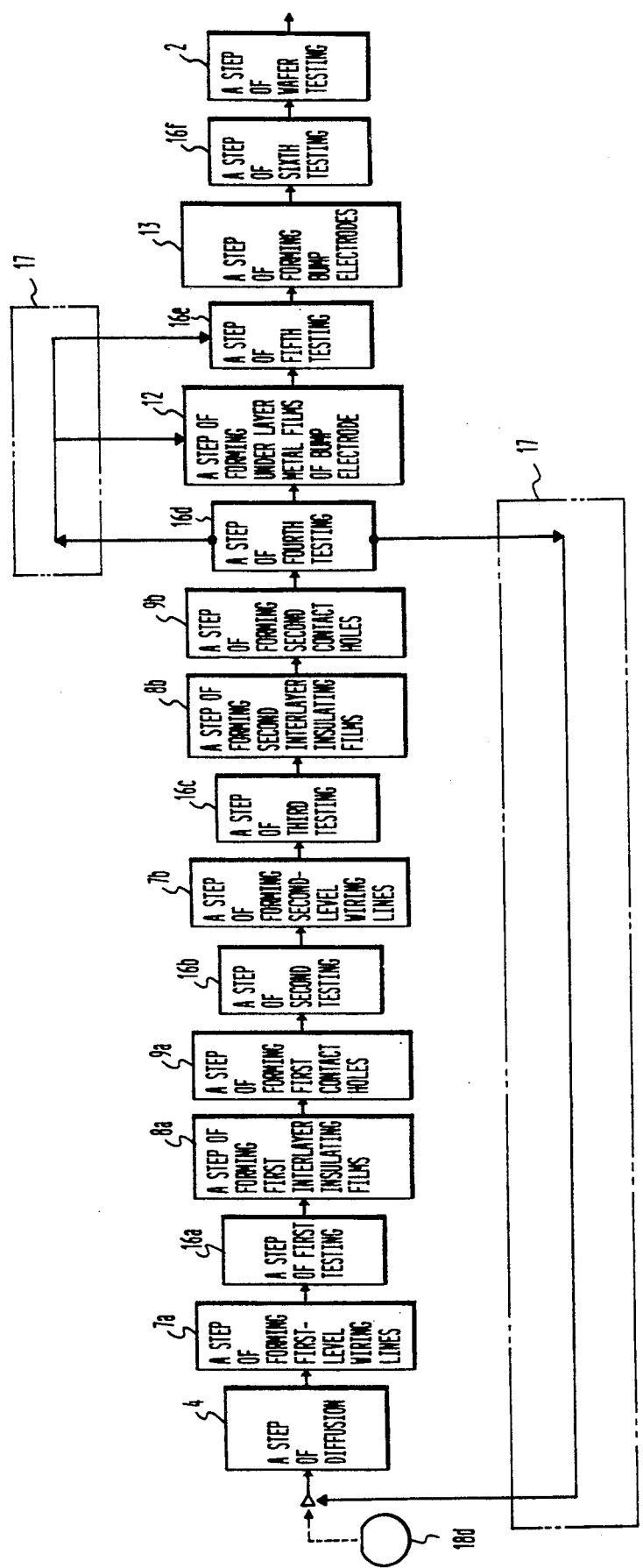
FIG. 8 is a flow chart showing a feedback loop and a feed forward loop for the control data which are prepared on the basis of instructions having been accomplished in the wafer processor of Embodiment 2.
Figure 9A:
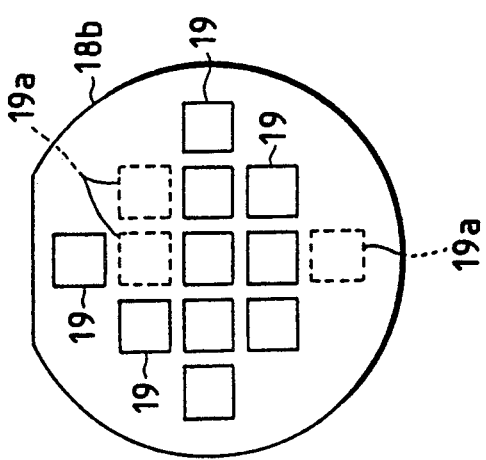
FIGS. 9(a) to 9(c) are top plan views showing a wafer in the process for manufacturing the semiconductor integrated circuit device according to Embodiment 2.
Figure 9B:
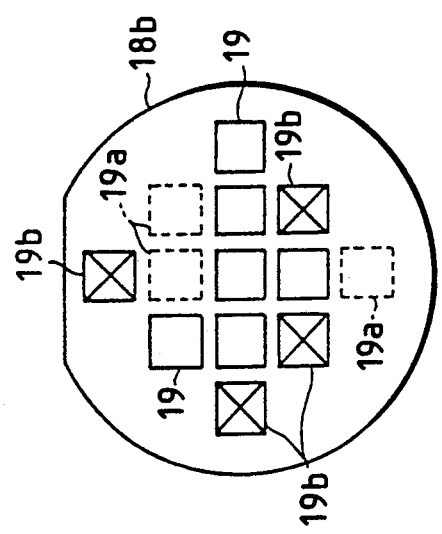
Figure 9C:
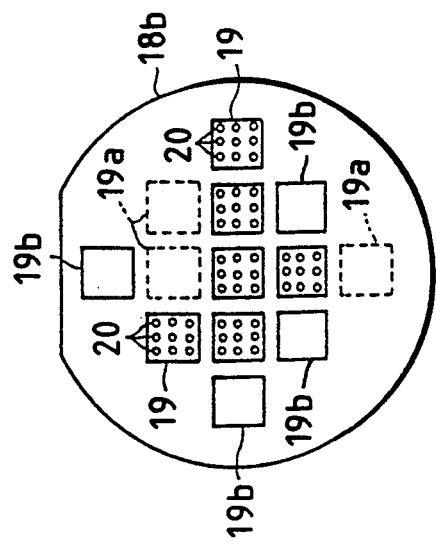
Figure 10:
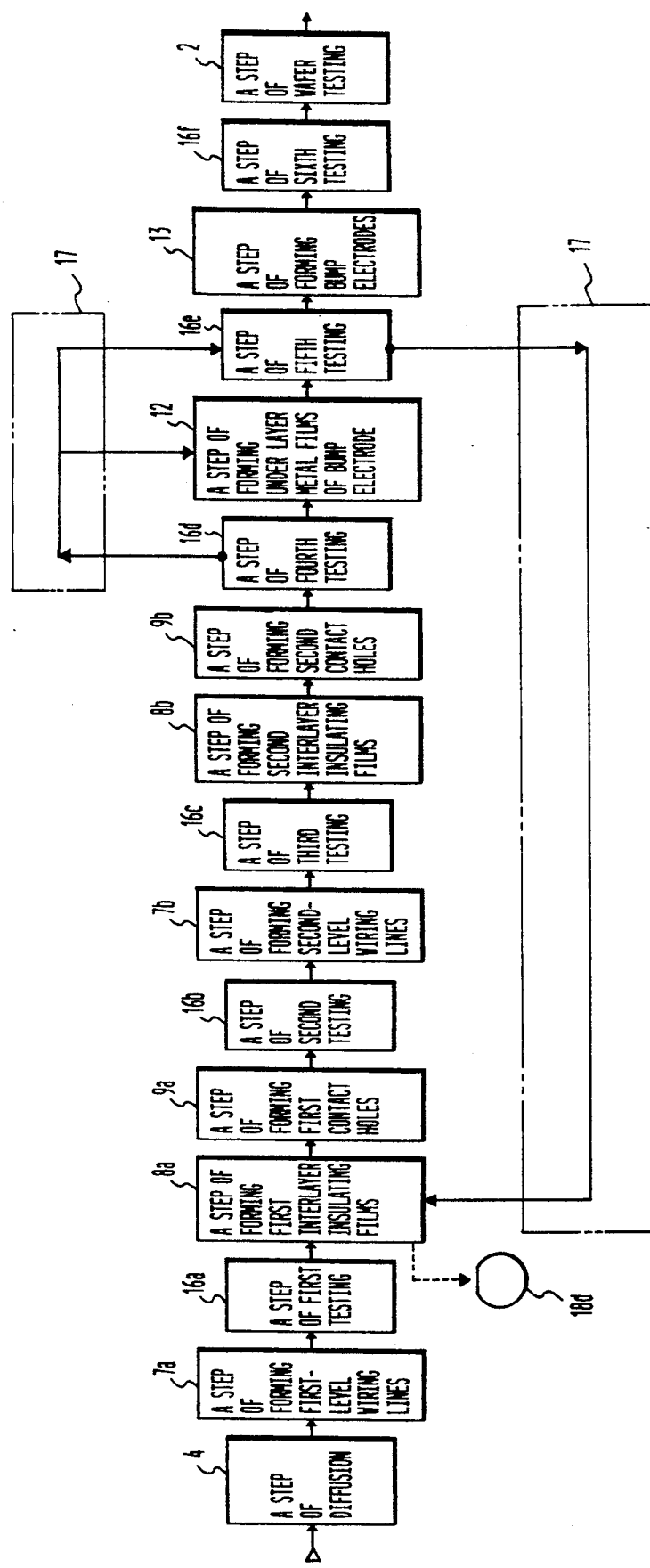
FIG. 10 is a flow chart showing a feedback loop and a feed forward loop for the control data which are prepared on the basis of instructions having been accomplished in the wafer processor of Embodiment 2.
Figure 11:
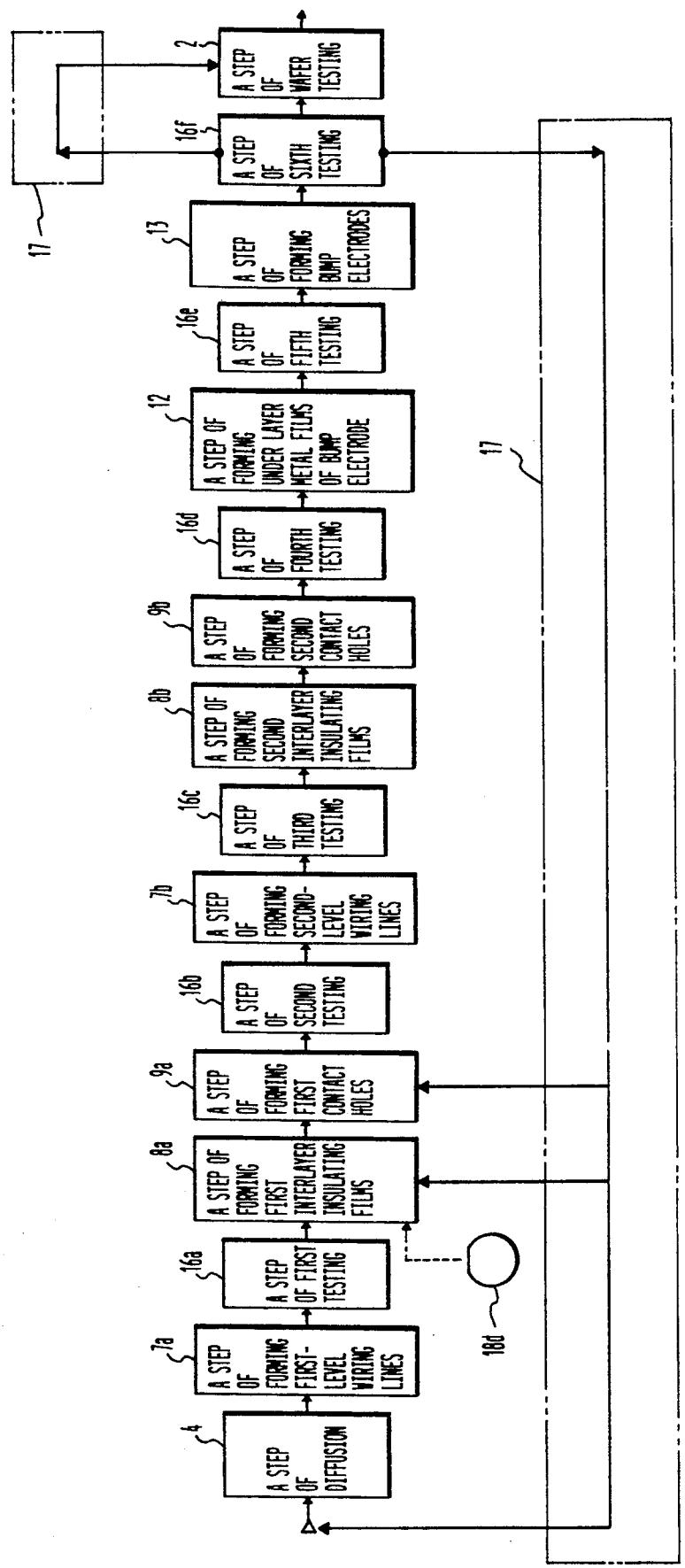
FIG. 11 is a flow chart showing a feedback loop and a feed forward loop for the control data which are prepared on the basis of instructions having been accomplished in the wafer processor of Embodiment 2.
Figure 12A:
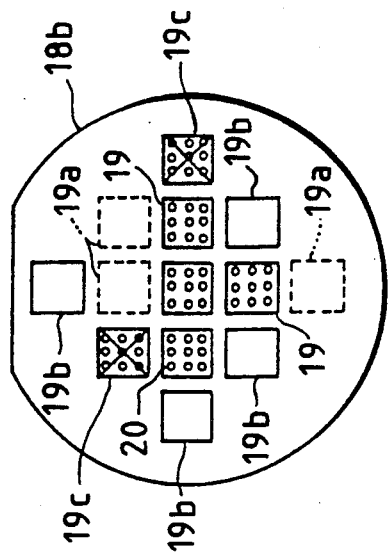
FIGS. 12(a) and 12(b) are top plan views showing a wafer in the process for manufacturing the semiconductor integrated circuit device according to Embodiment 2.
Figure 12B:
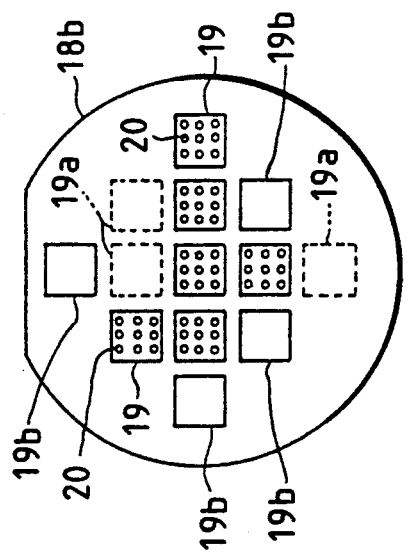

FIG. 5 is a top plan view showing a wafer to be used in a process for manufacturing the semiconductor integrated circuit device according to another embodiment of the present invention. FIG. 6 is a flow chart showing a feedback loop and a feed forward loop for the control data which are prepared on the basis of instructions having been accomplished in the wafer processor of Embodiment 2. FIGS. 7(a) to 7(c) are top plan views showing a wafer in the process for manufacturing the semiconductor integrated circuit device according to Embodiment 2. FIG. 8 is a flow chart showing a feedback loop and a feed forward loop for the control data which are prepared on the basis of instructions having been accomplished in the wafer processor of Embodiment 2. FIGS. 9(a) to 9(c) are top plan views showing a wafer in the process for manufacturing the semiconductor integrated circuit device according to Embodiment 2. FIG. 10 is a flow chart showing a feedback loop and a feed forward loop for the control data which are prepared on the basis of instructions having been accomplished in the wafer processor of Embodiment 2. FIG. 11 is a flow chart showing a feedback loop and a feed forward loop for the control data which are prepared on the basis of instructions having been accomplished in the wafer processor of Embodiment 2. FIGS. 12(a) and 12(b) are top plan views showing a wafer in the process for manufacturing the semiconductor integrated circuit device according to Embodiment 2.

In Embodiment 2, as shown in FIG. 5, the wafer 18b is arranged thereover with a plurality of chips 19. Of these, some are the testing chips 19. The wafer 18b has a diameter of about 5 inches, for example. Incidentally, the contents of the treatments of the individual treating steps 4 to 6 (as shown in FIG. 1) and the tests of the individual testing steps 16a to 16f are similar to those of the foregoing Embodiment 1. Therefore, the controls for forming non-defective chips in the wafer process will be described with reference to FIGS. 6 to 12.

First of all, the process line, as shown in FIG. 6, is loaded with the wafer 18b shown in FIG. 5. The wafer 18b arrives at the first testing step 16a through the diffusion step 4 and the first-level wiring line forming step 7a. Then, the first test is performed. On the basis of the test results, the computer 17 prepares the data of the chips, which have been described in the aforementioned Embodiment 1. Let it be assumed at the first testing step 16a that no defect is found in any of the chips 19. It is also assumed that the number of non-defective chips finally obtainable is neither excessive nor short.

Subsequently, the wafer 18b having been subjected to the first test arrives at the second testing step 16b through the first interlayer insulating film forming step 8a and the first contact hole forming step 9a. FIG. 7(a) shows the wafer 18b before the test. All the chips 19 of this wafer 18b are subjected to the second test. On the basis of the testing result, the computer 17 prepares the chip data which have been described in the aforementioned Embodiment 1. It is further assumed that three defective chips 19a are found over the wafer 18b by the test, as indicated by symbols × in FIG. 7(b).

On the other hand, the computer 17 compares the data of the chip, e.g., the number of non-defective chips 19 and the reference value of the number of non-defective chips obtainable at the testing stage. It is further assumed that the computer 17 decides the number of finally obtainable non-defective chips to be short, as a result of the comparison. At first, the computer 17 computes the number of chips to become short. On the basis of the computed value, the computer 17 then computes the optimum values such as the number of chips to be added or the number of wafers. The computer 17 further prepares the control data for loading another wafer on the basis of the optimum value. And, the computer 17 feeds the loading data back to the first step of the wafer process. As a result, the number of chips 19 is set to the optimum value to load a new wafer 18c at the first step of the wafer process. Thus, it is possible to supply the short chips at an early stage.

On the other hand, the computer 17 prepares the following control data on the basis of the data such as the positional coordinates of the non-defective chips or the defective chips 19a. The control data are those for inhibiting the treatments of the tested defective chips 19a and the tests of the chips 19a (as will also be referred to as the "inhibition data"). The computer 17 feeds the inhibition data forward to the second-level wiring line forming step 7b and the third testing step, for example, after the end of the tests. Incidentally, these inhibition data are utilized as those for all the subsequent treatments and tests.

Subsequently, the wafer 18b having ended its test advances to the second-level wiring line forming step 7b. In this second-level wiring line forming step 7b, the second-level wiring lines are patterned over the wafer 18b by the photo-lithography. In the second-level wiring line forming step 7b, on the other hand, the defective chips 10a are not formed with any wiring line pattern on the basis of the inhibition data prepared at the second testing step 16b. The defective chips 19a at this time are indicated by broken lines in FIG. 7(c). In short, the wiring lines patterns are formed only over the non-defective chips 19 in the second-level wiring line forming step 7b. As a result, the treatments to be applied to the defective chips 19a can be reduced to spare the cost accordingly. The wiring line patterns are formed over only the non-defective chips 19 in the following manner, for example. First of all, the wafer 18b is coated thereover with a wiring line metal film of Al or the like by the PVD method or the like. Subsequently, a photo resist (which will be shortly referred to as the "resist") is applied to the upper face of the wiring line metal film by the rotary method or the like. Next, the resist is subjected to an exposing treatment by a repeated projection exposing system (which will be shortly referred to as the "stepper"). At this time, the computer 17 transmits the aforementioned inhibition data to the stepper. On the basis of the inhibition data, only the non-defective chips are subjected to the exposing treatment. Incidentally, the technology for exposing the non-defective chips 19 only is disclosed in Japanese Patent Laid-Open No. 32130/1984, for example. After this exposure, a development is performed. At this time, a resist pattern can be formed in only the non-defective chips 19. After this, the resist is used as the mask to etch the wiring line metal film. Thus, the wiring line patterns are formed in only the non-defective chips 19.

In the subsequent third testing step 16c, too, only the non-defective chips 19 over the wafer 18b are tested on the basis of the inhibition data prepared in the aforementioned second testing step 16b. On the basis of the test results, the computer 17 prepares the data of the chips of the wafer 18b at the testing stage. On the other hand, it is assumed that the aforementioned wafer 18c newly loaded has reached the first testing step 16a and ended its test in that meanwhile. On the basis of the test results of the new wafer 18c, the computer 17 prepares the data of the chips of the wafer 18c. Here, the computer 17 monitors and grasps the data of the chips of the two wafers 18b and 18c synthetically. It is assumed that no defect is found in the chips of the wafer 18b or 18c at this stage. It is further assumed that the number of non-defective chips finally obtainable is decided to be neither excessive nor short as a result of the synthetic monitoring of the number of the non-defective chips of the two wafers 18b and 18c. In this case, the aforementioned control data are not prepared.

The subsequent steps will be described with reference to FIG. 8 and FIGS. 9(a) to 9(c). The wafer 18b having ended the third testing step 16c reaches the fourth testing step 16d through the second interlayer insulating film forming step 8b and the second contact hole forming step 9b. FIG. 9(a) shows the wafer 18b before the test. Only the non-defective chips 19 of that wafer 18b are subjected to the fourth test. On the basis of the testing results, the computer 17 prepares the chip data, as has been described in the foregoing Embodiment 1. It is assumed that four defective chips 19b are newly found over the wafer 18b as a result of the test, for example, as indicated by symbols × in FIG. 9(b). On the other hand, it is further assumed that the aforementioned newly loaded wafer 18c has reached the second testing step 16b and ended its test in that meanwhile. On the basis of the test results of the new wafer 18c, the computer 17 prepares the data of the chips of the wafer 18c. For simplicity of description, it is assumed that no defective chip is manufactured in the new wafer 18c. Here, the computer 17 monitors and grasps the number or the like of the non-defective chips 19 of the two wafers 18b and 18c synthetically. At this time, it is assumed that the computer 17 decides that the non-defective chips finally obtainable will become short. Then, the computer 17 prepares the loading data for loading another wafer like the aforementioned operations. And, the computer 17 feeds the loading data back to the first step of the wafer process 1. As a result, the new wafer 18d having its chip number set to the optimum value is loaded at the first step of the wafer process 1.

Moreover, the computer 17 prepares the control data for inhibiting the treatments after the tests and the tests of the defective chips 19a and 19b of the wafer 18b. And, the computer 17 feeds the inhibition data forward to the underlayer metal film forming step 12 and the fifth testing step 16e, for example. Incidentally, the inhibition data are utilized as those for all the subsequent treatments and tests.

In the step 12 for forming the underlayer metal films of bump electrode, only the non-defective chips are formed with the bump underlayer patterns 20, as shown in FIG. 9(c), on the basis of the inhibition data prepared in the fourth testing step 16d. The method of forming the bump underlayer patterns 20 over only the non-defective chips 19 may be similar to that of forming the aforementioned second-level wiring patterns, for example.

The subsequent steps will be described with reference to FIG. 10. The wafer 18b having ended the underlayer metal film forming step 12 reaches the fifth testing step 16e. At this fifth testing step 16e, too, only the non-defective chips 19 are tested on the basis of the inhibition data prepared in the fourth testing step 16d. On the basis of the testing results, the computer 17 prepares the data of the chips 19 of the wafer 18b. It is assumed that the wafers 18c and 18d already reached the third testing step 16c and the second testing step 16b, respectively, in that meanwhile so that both have ended their tests. The computer 17 prepares the data of the individual chips of the wafers 18c and 18d. Here, the computer 17 monitors and grasps the data of the chips of the three wafers 18b to 18d synthetically. It is further assumed that no defect is discovered at this stage in any of the chips 19 of the wafers 18b to 18d. It is further assumed that the computer 17 has decided that the number of non-defective chips finally obtainable will become excessive. Then, the computer 17 prepares the control data for reducing the treatments, for example. The reduction data could reduce the chips at the unit of chips but are prepared for interrupting the treatments of all the chips 19 over the wafer 18d, for example. The computer 17 feeds its reduction data back to the first interlayer insulating film forming step 8a, for example. According to these data, in the first interlayer insulating film forming step 8a, the new wafer 18d is not treated, but the wafer 18d is stocked.

The subsequent steps will be described with reference to FIG. 11 and FIGS. 12(a) and 12(b). The wafer 18b having ended the fifth testing step 16e reaches the sixth testing step 16f through the pump forming step 13. The wafer 18b at this time is shown in FIG. 12(a). On the basis of the test results, the computer 17 prepares the data of the chips, which have been described in the foregoing Embodiment 1. It is assumed that two defective chips 19c are discovered over the wafer 18b in the test, as indicated by symbols X in FIG. 12(b). On the other hand, the computer 17 monitors and grasps the number or the like of the non-defective chips of the two wafers 18b and 18c in the process line synthetically. At this time, it is assumed that the computer 17 decides that the number of the non-defective chips finally obtainable will become short. Then, the computer 17 prepares the loading data for loading another wafer like before. Here, the data are prepared for loading again the wafer 18d in the stocked state, for example. The computer 17 feeds the loading data back to the first interlayer insulating film forming step 8a. In this first interlayer insulating film forming step 8a, the stocked wafer 18d is loaded again. In case the loading is still short, a new wafer may be loaded at the first step of the wafer process 1. Thus, the short chips 19 can be supplied at an early stage. In case an excess supply is caused by loading the wafer 18d, the control data for reducing the number of chips to be treated may be prepared at the time of preparing the data for loading again the wafer 18d in the stocked state. And, the control data are fed back to the first contact hole forming step, for example. As a result, it is possible to reduce the treatments of the excessive non-defective chips chips 19 over the wafer 18d loaded again.

Moreover, the computer 17 prepares the control data for inhibiting the treatments after the tests and the test themselves of the defective chips 19a to 19c of the wafer 18b. The computer 17 feeds the inhibition data forward to the wafer testing step 2, for example.

Subsequently, the wafer 18b having ended the sixth testing step 16f reaches the wafer testing step 2. In this wafer testing step 2, only the non-defective chips 19 over the wafer 18b are tested on the basis of the inhibition data prepared at the sixth testing step 16f. As a result, it is possible to shorten the testing time period drastically.

Thus, the following effects can be achieved according to Embodiment 2.

(1) By deciding the defectiveness of each of the chips 19 over the wafers 18b to 18d in the wafer process 1, it is possible to reduce the spare treatments of the chips 19a and 19b which have been decided to be defective.

(2) The number of non-defective chips finally obtainable can be adjusted in the wafer process 1 by monitoring the number of the non-defective chips 19 of the whole group of the wafers 18b to 18c synthetically and by reducing or supplying the chips at the stage in which the number of the finally obtainable non-defective chips is decided to be excessive or short.

(3) Thanks to the aforementioned effects (1) and (2), it is possible to achieve only a necessary number of non-defective chips at last. As a result, it is possible to prevent the fluctuations in the yield of the chips.

(4) Thanks to the aforementioned effects (1) and (2), any spare treatment of the excessive chips or the defective chips 19a and 19b need not be performed so that the number and materials of treatments can be reduced to spare the production cost.

(5) Thanks to the aforementioned effects (1) and (2), the treating time period can be shortened more than that of the prior art to an extent corresponding to the reduction of the spare treatments of the excessive chips and the defective chips 19a and 19b.

(6) Thanks to the aforementioned effect (2), the short chips can be supplied at an early stage of the wafer process 1.

(7) Thanks to the aforementioned effect (6), it is possible to shorten the time period for retaining a necessary number of non-defective chips, as compared with that of the prior art.

(8) Thanks to the aforementioned effects (2), (3) and (6), it is possible to suppress the fluctuations in the production cost and time period for the manufacture of the semiconductor integrated circuit device.

(9) Thanks to the aforementioned effects (5) and (6), the chips may be supplied at their stage of shortage so that a necessary number of chips 19 can be set and treated from the start over the wafers 18b to 18d. In other words, the chips 19, which will be finally excessive, can be unset from the first over the wafers 18b to 18d. As a result, the spare treatment number can be reduced to spare the production cost.

(10) By feeding the data of that propriety of the chips over the wafers 18b to 18d, which has been decided in the wafer process 1, forward to the wafer testing step 2, only the non-defective chips 19 over the wafers 18b to 18d may be tested at the wafer testing step 2. As a result, it is possible to shorten the testing time period of the wafer testing step 2 drastically, as compared with that of the prior art.

(11) Thanks to the aforementioned effects (1) to (4) and (9), the production cost of the semiconductor integrated circuit device can be reduced to reduce the cost for the products.

(12) Thanks to the aforementioned effects (2), (5) to (7) and (10), it is possible to shorten the time period for the manufacture of the semiconductor integrated circuit device. As a result, the short delivery of the semiconductor integrated circuit device can be coped with.

(13) Thanks to the aforementioned effects (1) to (12), it is possible to cope with the customization, high integration and enlargement of the semiconductor integrated circuit device.

Embodiment 3

FIG. 13 is a flow chart showing a portion of the process for manufacturing a semiconductor integrated circuit device according to another embodiment of the present invention.

In Embodiment 3, the description to be made is directed to the case, in which a defect revising treatment is to be performed on the basis of the results of the individual testing steps in the wafer process. For simplicity of description, the revising treatment will be described in Embodiment 3 by extracting only the second testing step 16b and the treating steps before and after the step 16b.

Figure 13A:
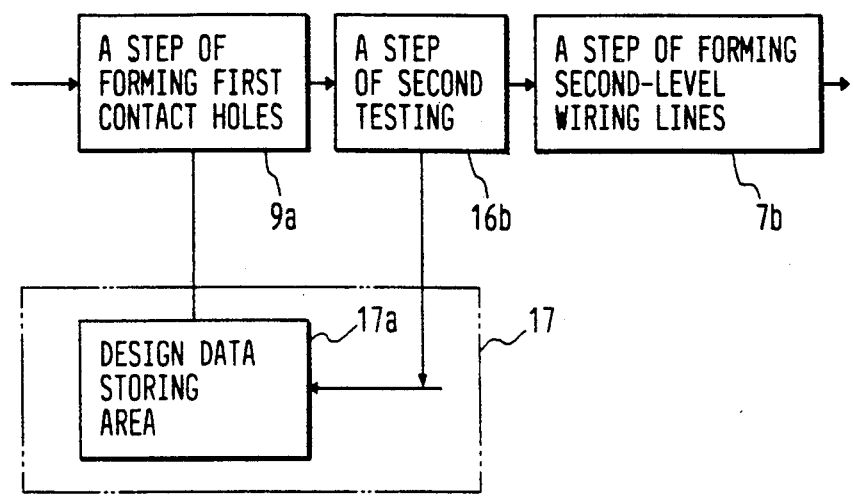
FIGS. 13(a) and 13(b) are flow charts showing a portion of the process for manufacturing a semiconductor integrated circuit device according to another embodiment of the present invention.

First of all, in the second testing step 16b shown in FIG. 13(a), each chip 19 of the wafer 18b (as shown in FIG. 5) is tested.

On the basis of the test results, the computer 17 prepares the data of the chips, as has been described in the foregoing Embodiment 1. Of the chip data, the propriety of each of the chips 19 is decided in the following manner. This decision is performed by comparing the test results and the reference design data which are stored in the design data storing area 17a of the computer 17. Moreover, the computer 17 prepares the data of the chips such as the positional coordinates of the defective chips 19a, the positional coordinates of the defective portions, or the degree or kind of the defects at the time of deciding the propriety of the chips 19. On the basis of the prepared data, still moreover, the computer 17 prepares the defect revising data. These defect revising data may be either those for revising the predetermined portions over the wafer 18b or the following ones: the revising data of the mask used in the first contact hole forming step 9a; or the revising data of the treating conditions at the time of forming the first contact holes.

Figure 13B:
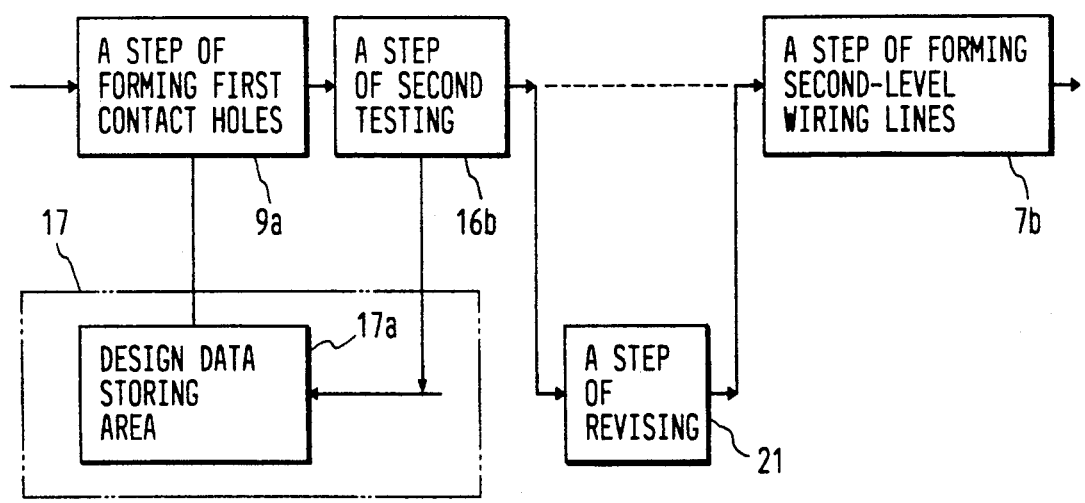

Subsequently, in Embodiment 3, a revising step 21 is inserted immediately after the second testing step 16b, as shown in FIG. 13(b). In this revising step 21, the revisions are performed on the basis of the defect revising data transmitted from the computer 17. At this time, those revising treatments may be performed according to the revising data such as the revising data or treating conditions of the mask. The wafer 18b thus having ended the revising treatment advances to the second-level wiring line forming step 7b.

Thus, the following effects can be attained according to Embodiment 3.

(1) Since the data of the defective chips are prepared in the wafer process 1 on the basis of the tests at the unit of chips, the positional coordinates or defective portions of the defective chips and the degree or kind of the defects can be tested faster and more precisely than the prior art. Since, moreover, the revisions are performed immediately after the tests on the basis of the defect data obtained by the tests, it is possible to improve the reliability and workability of the revising treatment drastically.

(2) The fluctuations in the chip production yield can be suppressed by revising the defective chips in the wafer process 1.

(3) Thanks to the aforementioned effects (1) and (2), the fluctuations in the production cost of the semiconductor integrated circuit device can be suppressed to drop the production cost.

Although our invention has been specifically described on the basis of the embodiments thereof, it should not be limited to the foregoing Embodiments 1 to 3 but could naturally be modified in various manners without departing from the gist thereof.

In the foregoing Embodiments 1 and 2, for example, the description has been simplified by feeding the reduction data for reducing the treatments of excessive chips and the loading data for loading again the wafer in the stocked state, back to one treating step. The feedback should not be limited thereto but can be modified in various manners. For example, the reduction data can be fed back to a plurality of treating steps to stock a plurality of wafers simultaneously, or a predetermined number of wafers in the stocked state can be loaded again.

In the foregoing Embodiment 2, on the other hand, the description has been directed to the case, in which the control data for reducing the treatments of the defective chips are fed forward to the treating step after the tests. The feed forward should not be limited thereto, but the control data for reducing the treatments of the excessive chips can be fed forward to the treating step after the tests. In this modification, the number of treatments can be reduced to spare the production cost accordingly.

In the foregoing Embodiment 2, moreover, the stepper is used at the time of resist exposing treatment for patterning the second-level wiring lines. However, the exposure should not be limited thereto, but an electron beam direct drawing system may be used for the resist exposing treatment. In this modification, the data for drawing only the non-defective chips may be set in the drawing data.

In the foregoing Embodiment 3, on the other hand, only the revising treatment is described but should not be limited thereto. For example, the revising treatment may be combined with the formation control such as the supply of chips or the reduction of treatments, as has been described in the foregoing Embodiments 1 and 2.

In the foregoing Embodiments 1 to 3, on the other hand, the testing steps are inserted after the wiring line forming step or the contact hole forming step. However, the testing steps should not be limited thereto but can be modified in various manners.

In the description thus far made, our invention has been applied mainly to the process for manufacturing the semiconductor integrated circuit device, i.e., its background field of application. The invention should not be limited thereto but can be modified in various manners. For example, the invention can be applied to a process for manufacturing a wiring substrate such as a printed wiring substrate or a ceramics wiring substrate. In this modification, the board formed integrally with a plurality of wiring substrates corresponds to the wafer, and the individual wiring substrates over the board correspond to the chips.

The effects to be obtained from the representative of the invention disclosed herein will be briefly described in the following.

(1) The spare treatments of the defective chips or excessive chips can be reduced in the wafer process. This reduction in the treatments makes it possible to reduce the number of steps of treatments and the treating materials and to shorten the treating time period. As a result, it is possible to reduce the production cost of the semiconductor integrated circuit device and to shorten the time period for the production.

(2) At the wafer testing step, for example, the defective chips chips need not be tested. In other words, the tip of the probe may be brought into abutment against only the non-defective chips at the time of the wafer testing step. Thus, the testing time period for the wafer testing step can be shortened. As a result, it is possible to shorten the time period for the manufacture of the semiconductor integrated circuit device.

(3) The treatments of the excessive ones of the non-defective chips of another subsequent wafer can be reduced in the wafer process. Thus, the number and materials of the treatments can be reduced by the reduction in the treatments, and the treating time period can be shortened. As a result, it is possible to drop the cost for the manufacture of the semiconductor integrated circuit device and to shorten the time period for the manufacture.

(4) The short chips can be supplied in the wafer process. At the time of manufacturing the short chips, moreover, the number of wafers to be loaded and the number of chips to be set in the wafer can be set to the optimum values on the basis of the data of the aforementioned chips. In short, the number of the non-defective chips finally obtainable can be adjusted in the wafer process. Thus, the fluctuations in the chip production yield can be suppressed. As a result, it is possible to suppress the fluctuations in the cost for the manufacture of the semiconductor integrated circuit device and to drop the cost for the manufacture. Since, moreover, the fluctuations in the chip production yield can be suppressed, it is also possible to suppress the fluctuations in the time period for the manufacture of the semiconductor integrated circuit device. Since the manufacture of the short chips is started in the wafer process, still moreover, it is possible to shorten the time period for retaining a necessary number of non-defective chips. As a result, it is possible to shorten the time period for the manufacture of the semiconductor integrated circuit device. Thus, it is possible to cope with the customization, high integration, enlargement and short delivery of the semiconductor integrated circuit device.

(5) It is possible to supply the short chips in the wafer process and to reduce the treatments of the excessive chips in the wafer process. In short, the number of non-defective chips finally obtainable can be adjusted in the wafer process. In addition, it is possible to reduce the treatments of the chips which were decided to be defective as a result of the tests in the wafer process. As a result, it is possible to obtain a desired number of non-defective chips over the wafer at last. Thus, it is possible to prevent the fluctuations in the chips production yield. As a result, it is possible to suppress the fluctuations in the production cost of the semiconductor integrated circuit device and to drop the production cost. Since, moreover, the fluctuations in the chip production yield can be suppressed, it is also possible to suppress the fluctuations in the time period for the manufacture of the semiconductor integrated circuit device. Since, moreover, the manufacture of the short chips is started in the wafer process, it is possible to shorten the time period for retaining a desired number of non-defective chips. As a result, it is possible to shorten the time period for the manufacture of the semiconductor integrated circuit device. Thus, it is possible to cope with the customization, high integration, enlargement and short delivery of the semiconductor integrated circuit device.

(6) From the aforementioned data of the chips, the positional coordinates or defective portions of the defective chips and the degree and kind of the defects can be tested faster and more precisely than the prior art. On the basis of the defect revising data obtained from the test results, moreover, the revisions are performed immediately after the tests so that the reliability and workability of the revising treatments can be drastically improved. By revising the defective chips in the wafer process 1, moreover, the fluctuations in the chip production yield can be suppressed. Thus, it is possible to suppress the fluctuations in the production cost of the semiconductor integrated circuit device and to drop the production cost.

What is claimed is:

1. In a wafer process for manufacturing a semiconductor integrated circuit device by subjecting a semiconductor wafer to a plurality of treating steps,
   a process for manufacturing a semiconductor integrated circuit device, comprising the repeated steps of:
   testing said semiconductor wafer at a unit of chip each time a predetermined one of said treating steps is ended;
   preparing control data for loading another semiconductor wafer on the basis of the data of each of said chips and feeding the control data back to a predetermined treating step of the wafer process if it is decided in accordance with the data of each chip based upon the test results that the number of non-defective chips at the testing stage is short of the necessary number for the testing step;
   performing said tests of the semiconductor wafers including said another one; and
   monitoring the data of the chips of the initially loaded semiconductor wafer and the added semiconductor wafer synthetically and feeding control data for loading another semiconductor wafer, each time it is decided that the number of non-defective chips is short of the necessary number for the testing step in its entirety, back to a predetermined treating step of the wafer process.

2. A process for manufacturing a semiconductor integrated circuit device according to claim 1, further comprising the steps of:
   feeding control data to restrict any further treating step, any further testing step of a chip or chips which have been detected as being defective during any of the testing steps.

3. A process for manufacturing a semiconductor integrated circuit device according to claim 2, wherein the control data for restricting are fed forward to the step after the end of said wafer process.

4. A process for manufacturing a semiconductor integrated circuit device according to claim 1, further comprising the steps of:
   feeding control data to restrict any further treating step and any testing step of a chip or chips which exceed a predetermined number of non-defective chips desired, in response to the test results which indicate the total number of non-defective chips available.

5. A process for manufacturing a semiconductor integrated circuit device according to claim 1, wherein if a defect is discovered by comparing the result of the test and the designed reference data of the treating step preceding the test, control data for revising the defect are prepared on the basis of the compared data to revise the defect immediately after the test on the basis of the control data.

6. A process for manufacturing a semiconductor integrated circuit device according to claim 5, wherein the pattern of a mask used in the treating step before said test is revised immediately after the test on the basis of the control data for revising the defect.

7. A process for manufacturing a semiconductor integrated circuit device according to claim 5, wherein the treating conditions of the treating step before said test are revised immediately after the test on the basis of the control data for revising the defect.

8. A process for manufacturing a semiconductor integrated circuit device according to claim 1, wherein said process for manufacturing a semiconductor integrated circuit device is controlled by using a computer.

9. In a wafer process for manufacturing a semiconductor integrated circuit device by subjecting a semiconductor wafer to a plurality of treating steps, a process for manufacturing a semiconductor integrated circuit device, comprising the commands of:

testing said semiconductor wafer at a unit of chip each time a predetermined one of said treating steps is ended;

preparing control data for loading another semiconductor wafer on the basis of the data of each of said chips and feeding the control data back to a predetermined treating step of the wafer process if it is decided in accordance with the data of each chip at the testing stage that the number of non-defective chips is short of the necessary number for the testing step;

repeating performing said tests of the semiconductor wafers including said another one, monitoring the data of the chips of the initially loaded semiconductor wafer and the added semiconductor wafer synthetically, and feeding control data for loading another semiconductor wafer, each time it is decided that the number of non-defective chips is short of the necessary number for the testing step in its entirety, back to a predetermined treating step of the wafer process;

preparing control data for restricting the chip to be subjected to a treating step before the test and a testing step, if it is decided as a result of the data of said chips that the number of non-defective chips exceeds the necessary number at the testing stage, and feeding said control data as the treating data for another succeeding semiconductor wafer back to the treating step and testing step preceding the test by at least one; and preparing control data for restricting a chip to be subjected to the treating step after the test on the basis of the data of said chip, and feeding said control data back to a treating step preceding the test by at least one.

10. A process for manufacturing a semiconductor integrated circuit device, according to claim 9, wherein, if a defect is discovered by comparing the result of the test and the designed reference data of the treating step preceding the test, control data for revising the defect are prepared on the basis of the compared data to revise the defect immediately after the test on the basis of the control data.

11. A process for manufacturing a semiconductor integrated circuit device, according to claim 9, wherein the data for restricting the chip to be subjected to the treating step after the test are fed forward to the step after the end of said wafer process.

12. A process for manufacturing a semiconductor integrated circuit device according to claim 9, wherein said process for manufacturing a semiconductor integrated circuit device is controlled by using a computer.

* * * * *